(12) United States Patent
Goux et al.

(10) Patent No.: US 7,700,981 B2
(45) Date of Patent: Apr. 20, 2010

(54) INTEGRATION OF CAPACITIVE ELEMENTS IN THE FORM OF PEROVSKITE CERAMIC

(75) Inventors: Ludovic Goux, Grand Hallet (BE); Monique Gervais, Larcay (FR)

(73) Assignee: STMicroelectronics S.A. Universite Francois Rabelais, Montrouge (FR)

( * ) Notice: Subject to any disclaimer, the term of this patent is extended or adjusted under 35 U.S.C. 154(b) by 751 days.

(21) Appl. No.: 11/407,681

(22) Filed: Apr. 20, 2006

(65) Prior Publication Data

US 2007/0007565 A1    Jan. 11, 2007

(30) Foreign Application Priority Data

Apr. 20, 2005    (FR) .................................. 05 51008

(51) Int. Cl.
H01L 29/76 (2006.01)
(52) U.S. Cl. .................. 257/295; 257/410; 257/532; 257/628; 257/741
(58) Field of Classification Search .......... 257/295, 257/410, 532, 628, 741
See application file for complete search history.

(56) References Cited

U.S. PATENT DOCUMENTS 6,518,609 B1 *   2/2003   Ramesh ................. 257/295
2002/0197489 A1 * 12/2002  Lee et al. ................ 428/446
2003/0062553 A1   4/2003   Ramesh et al.
2005/0040516 A1 * 2/2005   Sakashita et al. ............ 257/709

FOREIGN PATENT DOCUMENTS

WO    WO 2004/005587 A    7/2004

OTHER PUBLICATIONS

French Search Report from corresponding French National Application No. 05/51008, filed Apr. 20, 2005.
Liu B.T. et al., *Epitaxial La-doped SrTiO3 on Silicon: A conductive Template for Epitaxial Ferroelectrics on Silicon*, Applied Physics Letters, AIP, American Institute of Physics, Melville, NY, US, vol. 80, No. 25, Jun. 24, 2004, pp. 4801-4803, XP.
Vashook V.V. et al., *Oxygen Nonstoichiometry and some transport Properties of LaSrNi04-Delta Nickelate*, Solid State Ionics, North Holland Pub. Co., Amsterdam, NL, vol. 131, No. 3-4, Jun. 2, 2000, XP004210070.

* cited by examiner

*Primary Examiner*—Edward Wojciechowicz
(74) *Attorney, Agent, or Firm*—Lisa K. Jorgenson; James H. Morris; Wolf, Greenfield & Sacks, P.C.

(57) ABSTRACT

The use of a conductive bidimensional perovskite as an interface between a silicon, metal, or amorphous oxide substrate and an insulating perovskite deposited by epitaxy, as well as an integrated circuit and its manufacturing process comprising a layer of an insulating perovskite deposited by epitaxy to form the dielectric of capacitive elements having at least an electrode formed of a conductive bidimensional perovskite forming an interface between said dielectric and an underlying silicon, metal, or amorphous oxide substrate.

16 Claims, No Drawings

INTEGRATION OF CAPACITIVE ELEMENTS IN THE FORM OF PEROVSKITE CERAMIC

BACKGROUND OF THE INVENTION

1. Field of the Invention

The present invention relates to the forming of capacitive elements in an integrated circuit. The present invention more specifically relates to the forming of capacitive elements based on perovskite oxides.

The invention applies, for example, to the forming of high-density memory integrated circuits in which the memory point capacitors are formed in a perovskite layer to form the dielectric.

2. Discussion of the Related Art

A difficulty of the use of perovskite oxides in the forming of semiconductor circuits is linked to the poor crystal growth of perovskites on silicon substrate. The thin perovskite layer or film deposited on a silicon substrate does not maintain the properties of the single crystal or of the ceramic. An interface must thus be interposed between the silicon substrate and this perovskite. The same problems are posed for the crystal growth of perovskites on a metal layer or on an amorphous oxide, which form the other types of layers above which it is generally desired to form integrated capacitors.

To maintain the single-crystal structure of the perovskite forming the dielectric of the capacitive elements, the interface on which this perovskite is deposited must enable deposition by epitaxy. Further, this interface must adhere in crystallized form on the underlying substrate and form a diffusion and reaction barrier between the silicon (oxidized or not) and the perovskite.

Among the perovskites generally used to form the dielectric layers deposited by epitaxy on silicon substrates, one can find:

barium strontium titanates (BST) having formula $(Ba,Sr)TiO_3$;

lead zirconate titanates (PZT), of formula $Pb(Zr,Ti)O_3$ and their derivatives such as, for example, lead lanthanum zirconate titanates (PLZT); and double layer perovskites such as strontium bismuth tantalate (SBT) of formula $SrBi_2Ta_2O_9$, or strontium bismuth niobate (SBN) of formula $SrBi_2Nb_2O_9$.

To enable deposition of such perovskites on a silicon oxide substrate ($SiO_2$), an interface formed of a BiT perovskite ($Bi_4Ti_3O_{12}$) is generally used.

A disadvantage of using BiT as an interface is that it is an insulating perovskite. Accordingly, to form a capacitive element from an $SiO_2$ substrate, the BiT must be covered with another conductive perovskite, for example, LSCO ((La,Sr)$CoO_3$), before depositing the dielectric layer.

A disadvantage then is a complexity of the forming process and of the obtained structure.

An example of use of BiT as an interface for the epitaxy of a perovskite is described in the article: "Template Approaches to Growth of Oriented Oxide Heterostructures on $SiO_2$/Si" by R. Ramesh et al. published in 1994 in "Journal of Electronic Materials", Vol. 23, n° 1.

SUMMARY OF THE INVENTION

The present invention aims at providing a novel interface between a silicon, metal, or amorphous oxide substrate and a perovskite deposited by epitaxy and forming the dielectric of an integrated capacitive element.

The present invention especially aims at providing an interface preserving the single-crystal properties of the perovskite forming the dielectric.

The present invention also aims at providing an interface of simple structure.

The present invention further aims at providing a method for forming such an interface which is compatible with technologies currently used in microelectronics and which is easy to form.

To achieve these and other objects, the present invention provides the use of a conductive bidimensional perovskite as an interface between a silicon, metal, or amorphous oxide substrate and an insulating perovskite deposited by epitaxy.

According to an embodiment of the present invention, the conductive bidimensional perovskite is used to form one of the electrodes of capacitive elements having their dielectric formed by the perovskite deposited by epitaxy.

According to an embodiment of the present invention, the conductive bidimensional perovskite is strontium lanthanum nickelate of formula $La_{(2-x)}Sr_xNiO_{(4\pm y)}$.

The present invention also aims at a method for forming capacitive elements in an integrated circuit on a silicon, metal, or amorphous oxide substrate, comprising the deposition by epitaxy of an insulating perovskite to form the dielectric of the capacitive elements, and the use as an interface between the insulating perovskite and the substrate of a conductive bidimensional perovskite.

According to an embodiment of the present invention, the interface is exclusively formed of said conductive bidimensional perovskite.

According to an embodiment of the present invention, the interface perovskite is selected to exhibit a quadratic crystal structure.

According to an embodiment of the present invention, the interface perovskite is of formula:

$La_{(2-x)}A_xBO_{(4\pm y)}$ where A is the dopant, and where B is a metal.

According to an embodiment of the present invention, the dopant rate and the oxygen content are selected according to the desired conductivity.

The present invention further provides an integrated circuit comprising a layer of an insulating perovskite deposited by epitaxy to form the dielectric of capacitive elements, at least an electrode of the capacitive elements being formed of a conductive bidimensional perovskite forming an interface between said dielectric and an underlying silicon, metal, or amorphous oxide substrate.

According to an embodiment of the present invention, the interface is exclusively formed of said conductive bidimensional perovskite.

According to an embodiment of the present invention, said conductive bidimensional perovskite is strontium lanthanum nickelate.

The foregoing objects, features, and advantages of the present invention, as well as others, will be discussed in detail in the following non-limiting description of specific embodiments and implementation modes.

DETAILED DESCRIPTION

A feature of the present invention is to provide the use of a conductive bidimensional perovskite as an interface between the substrate and the dielectric perovskite.

A bidimensional perovskite is defined as having a crystal axis along which mesh parameter "c" is very different from the mesh parameters ("a" and "b") of the other axes which are, as for them, of the same order of magnitude. The perovskite of the present invention is selected to have mesh parameters "a" and "b" close to most of the dielectric perovskites to be deposited by epitaxy.

Preferably, this perovskite exhibits a quadratic crystal structure, which gives it a capacity to grow along the axis of parameter "c". Its growth on a silicon substrate, be it oxidized or not, is thus favored.

Another feature of the present invention is that the interface is formed of a single conductive material. It can then form the electrode of the capacitive element and directly receive the conventional dielectric perovskite.

According to a preferred embodiment of the present invention, the selected perovskite is a nickel-based perovskite. For example, strontium lanthanum nickelate of formula $La_{(2-x)}Sr_xNiO_{(4\pm y)}$.

The deposition of such a perovskite directly on a silicon oxide substrate is performed according to an embodiment of the present invention by laser ablation under the following conditions. The substrate is brought to a temperature ranging between 650 and 750° C., for example, 700° C. The assembly is processed in a residual oxygen atmosphere between 0.05 and 0.5 millibars, for example, 0.1 millibar. Strontium lanthanum nickelate further has the feature of being a product existing in solid form, which enables using a single target for the laser ablation.

The thickness of the deposition ranges, preferably, between 200 and 700 nanometers. The minimum limit aims at avoiding interactions with the underlying substrate. The maximum limit preserves the stability of the obtained layer. Preferably, the thickness will be on the order of from 200 to 300 nanometers.

The other features of the laser ablation deposition are within the abilities of those skilled in the art according to the application. As a specific example, a cooling under oxygen at a pressure of approximately 100 millibars or more may be provided. The wavelength of the used laser will preferably be smaller than 300 nanometers. Its frequency will range between 1 and 20 Hertz and the duty cycle will be selected for a pulse duration ranging between 10 and 20 nanoseconds. Such ablation conditions are a preferred, though non-limiting, embodiment.

It should be noted that the present invention enables deposition of the two perovskites (conductive interface perovskite to form the electrode and insulating perovskite of the dielectric) without opening the laser ablation chamber. This contributes to optimizing the manufacturing process.

An advantage of the present invention is that the perovskite can be deposited indifferently on silicon, metal, or an amorphous oxide (for example, $SiO_2$).

Another advantage of the present invention is that the perovskite which has been grown on the above-mentioned substrate enables epitaxial deposition of an insulating perovskite to form the dielectric of the capacitive element. All the previously-mentioned perovskite families can be deposited by epitaxy on an interface according to the present invention.

The conductivity of the bidimensional perovskite used as an interface according to the present invention can be adjusted by the dopant rate (in the above example, strontium) and/or the oxygen content.

Considering the above example of ablation deposition, it has been possible to deposit an $La_{0.9}Sr_{1.1}NiO_4$ perovskite with a crystal orientation quality greater than 95% on an $SiO_2$ or silicon substrate in a plane 100 with a conductivity on the order of one milliohm.centimeter. An insulating $Ba_{(1-x)}Sr_xTiO_3$ perovskite deposition by the same method on the above-mentioned interface has exhibited a very good orientation (mismatch of 4% in mesh parameters).

Of course, the present invention is likely to have various alterations, modifications, and improvements which will readily occur to those skilled in the art. In particular, other deposition conditions than those indicated hereabove may be provided, provided to respect a deposition by laser ablation of the conductive perovskite interface for a deposition immediately overlying a dielectric perovskite by epitaxy.

Further, other materials than those indicated as an example hereabove may be used. It should however be noted that, to obtain the advantages of the present invention, the conductive perovskite interface must be deposited directly on a silicon, metal, or amorphous oxide substrate and directly receive the dielectric perovskite of the capacitive element. This last perovskite deposited by epitaxy may however be formed of several layers according to the desired thickness.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. An interface between a silicon, metal, or amorphous oxide substrate and an insulating perovskite, the interface comprising a single layer of a conductive bidimensional perovskite disposed directly on the substrate, the insulating perovskite being epitaxially deposited directly on the conductive bidimensional perovskite layer.

2. The interface of claim 1, wherein the interface forms an electrode of one or more capacitive elements and the insulating perovskite forms a dielectric of the one or more capacitive elements.

3. The interface of claim 1, wherein the conductive bidimensional perovskite comprises strontium lanthanum nickelate, $La_{(2-x)}Sr_xNiO_{(4\pm y)}$.

4. An integrated circuit on a silicon, metal or amorphous oxide substrate comprising:
   an interface layer comprising a single layer of a conductive bidimensional perovskite disposed directly on the substrate; and
   a layer of an insulating perovskite epitaxially deposited directly on the conductive bidimensional perovskite layer forming a dielectric of one or more capacitive elements.

5. The integrated circuit of claim 4, wherein the interface layer consists essentially of said conductive bidimensional perovskite.

6. The integrated circuit of claim 4, wherein said conductive bidimensional perovskite is strontium lanthanum nickelate.

7. The integrated circuit of claim 4, wherein said conductive bidimensional perovskite is $La_{(2-x)}A_xBO_{(4\pm y)}$, where A is a dopant, and B is a metal.

8. The integrated circuit of claim 4, wherein the interface layer has a thickness of between about 200 nm and about 700 nm.

9. The integrated circuit of claim 4, wherein the interface layer has a thickness of between about 200 nm and about 300 nm.

10. The integrated circuit of claim 4, wherein a lattice mismatch between the interface layer and the insulating perovskite layer is equal to or less than about 4%.

11. A capacitive element comprising:
    a substrate;

a conductive layer comprising a single layer of a conductive bidimensional perovskite disposed directly on the substrate forming a first electrode;

a dielectric layer comprising an insulating dielectric perovskite that is disposed directly on and epitaxial with the conductive bidimensional perovskite layer, wherein the conductive layer is an interface between the substrate and the dielectric layer; and a second electrode disposed on the dielectric layer.

12. The capacitive element of claim 11, wherein the conductive bidimensional perovskite is strontium lanthanum nickelate.

13. The capacitive element of claim 11, wherein the conductive bidimensional perovskite is $La_{(2-x)}A_xBO_{(4\pm y)}$, where A is a dopant, and B is a metal.

14. The capacitive element of claim 11, wherein the conductive layer has a thickness of between about 200 nm and about 700 nm.

15. The capacitive element of claim 11, wherein the conductive layer has a thickness of between about 200 nm and about 300 nm.

16. The capacitive element of claim 11, wherein a lattice mismatch between the interface layer and the dielectric perovskite layer is equal to or less than about 4%.

* * * * *

UNITED STATES PATENT AND TRADEMARK OFFICE
CERTIFICATE OF CORRECTION

PATENT NO. : 7,700,981 B2 Page 1 of 1
APPLICATION NO. : 11/407681
DATED : April 20, 2010
INVENTOR(S) : Ludovic Goux et al.

It is certified that error appears in the above-identified patent and that said Letters Patent is hereby corrected as shown below:

Title Page, Item (75) should read:
(75) Inventors Ludovic Goux, Hannut (BE)
Monique Gervais, Larcay (FR)

Signed and Sealed this

Fifteenth Day of June, 2010

David J. Kappos
*Director of the United States Patent and Trademark Office*

UNITED STATES PATENT AND TRADEMARK OFFICE
CERTIFICATE OF CORRECTION

PATENT NO. : 7,700,981 B2
APPLICATION NO. : 11/407681
DATED : April 20, 2010
INVENTOR(S) : Ludovic Goux et al.

It is certified that error appears in the above-identified patent and that said Letters Patent is hereby corrected as shown below:

Item (73) should read:
(73) Assignee: STMicroelectronics S.A, Montrouge, (FR)
Universite Francois Rabelais UFR Sciences & Techniques, Tours (FR)

Signed and Sealed this

Seventeenth Day of August, 2010

David J. Kappos
*Director of the United States Patent and Trademark Office*